(12) United States Patent
Otsuka et al.

(10) Patent No.: US 8,188,602 B2
(45) Date of Patent: May 29, 2012

(54) SEMICONDUCTOR DEVICE HAVING MULTILEVEL COPPER WIRING LAYERS AND ITS MANUFACTURE METHOD

(75) Inventors: Satoshi Otsuka, Kawasaki (JP); Shun-ichi Fukuyama, Kawasaki (JP)

(73) Assignee: Fujitsu Semiconductor Limited, Yokohama-Shi (JP)

( * ) Notice: Subject to any disclaimer, the term of this patent is extended or adjusted under 35 U.S.C. 154(b) by 1059 days.

(21) Appl. No.: 10/350,219

(22) Filed: Jan. 24, 2003

(65) Prior Publication Data
US 2003/0227086 A1 Dec. 11, 2003

(30) Foreign Application Priority Data
Jun. 10, 2002 (JP) ................. 2002-168187

(51) Int. Cl.
*H01L 51/46* (2006.01)
(52) U.S. Cl. ........ 257/758; 257/759; 257/760; 257/774; 257/E29.132; 438/622
(58) Field of Classification Search ............... 257/296, 257/306, 307, 308, 906, 907, 908, 774, 758, 257/211, 760, 751, 767, 775, 762, 756, 759, 257/750; 438/253, 254, 396, 397, 398, 128, 438/129, 586, 637, 761, 763, 778, 931, 622, 438/623, 627, 629, 638, 639, 643
See application file for complete search history.

(56) References Cited

U.S. PATENT DOCUMENTS

| | | | |
|---|---|---|---|
| 5,705,232 A | 1/1998 | Hwang et al. | 427/512 |
| 5,965,679 A | 10/1999 | Godschalx et al. | 526/281 |
| 6,124,421 A | 9/2000 | Lau et al. | 528/169 |
| 6,152,148 A | 11/2000 | George et al. | 134/2 |
| 6,255,233 B1 * | 7/2001 | Smith et al. | 438/786 |
| 6,265,321 B1 | 7/2001 | Chooi et al. | 438/725 |

(Continued)

FOREIGN PATENT DOCUMENTS

JP 11-162965 6/1999

(Continued)

OTHER PUBLICATIONS

Stefan P. Hau-Reige et al.; "The Effects of the Mechanical Properties of the Confinement Material on Electromigration in Metallic Interconnects"; Journal of Materials Research; vol. 15, No. 8; Aug. 2000; pp. 1797-1802.

(Continued)

*Primary Examiner* — Tom Thomas
*Assistant Examiner* — Eduardo A Rodela
(74) *Attorney, Agent, or Firm* — Kratz, Quintos & Hanson, LLP

(57) ABSTRACT

To provide a semiconductor device having copper wiring layers and organic insulating resin layers with less separation and its manufacture method.

A semiconductor device has: a semiconductor substrate formed with a number of semiconductor elements; a first interlayer insulating film formed above the semiconductor substrate and having a first wiring recess; a first copper wiring embedded in the first wiring recess; a second interlayer insulating film having a second wiring recess, the second interlayer insulating film including a copper diffusion preventing layer formed on the first copper wiring and the first interlayer insulating film, an oxide film formed on the copper diffusion preventing layer, and an organic insulating resin layer formed on the oxide film; and a second copper wiring embedded in the second wiring recess.

17 Claims, 5 Drawing Sheets

U.S. PATENT DOCUMENTS

| | | | |
|---|---|---|---|
| 6,403,475 B1 * | 6/2002 | Tanabe et al. | 438/663 |
| 6,476,491 B2 * | 11/2002 | Harada et al. | 257/758 |
| 6,515,336 B1 * | 2/2003 | Suzawa et al. | 257/350 |
| 6,646,351 B2 * | 11/2003 | Watanabe et al. | 257/760 |
| 2002/0001941 A1 | 1/2002 | Kudo | 438/633 |
| 2003/0054622 A1 * | 3/2003 | Yamamura | |

FOREIGN PATENT DOCUMENTS

| | | |
|---|---|---|
| JP | 2000-150519 | 5/2000 |
| JP | 2000-223486 | 8/2000 |
| JP | 2001-053151 | 2/2001 |
| JP | 2001-085700 | 3/2001 |
| JP | 2001-257262 | 9/2001 |
| JP | 2002-016026 | 1/2002 |
| JP | 2002-064137 | 2/2002 |

OTHER PUBLICATIONS

Josh H. Golden et al.; "Designing Porous Low-k Dielectrics"; Semiconductor International; May 1, 2001; pp. 1-7.

"Symposium O: Low-Dielectric Constant Materials and Applications in Microelectronics"; Materials Research Society Symposium Proceedings Series; vol. 565; Apr. 1999; pp. 1-21.

Michael E. Clarke; "Introducing Low-k Dielectrics into Semiconductor Processing"; Applications Note MAL123; Jun. 11, 2001; pp. 1-20.

Japanese Office Action dated Oct. 25, 2005 with English translation.

Chinese Office Action dated Jul. 14, 2006 with English translation, 6 pages.

Korean Office Action mailed Aug. 18, 2008, with an English-language translation thereof.

Japanese Office Action dated May 16, 2006 with English translation, 5 pages.

* cited by examiner

SEMICONDUCTOR DEVICE HAVING MULTILEVEL COPPER WIRING LAYERS AND ITS MANUFACTURE METHOD

CROSS REFERENCE TO RELATED APPLICATION

This application is based on Japanese Patent Application No. 2002-168187, filed on Jun. 10, 2002, the entire contents of which are incorporated herein by reference.

BACKGROUND OF THE INVENTION

A) Field of the Invention

The present invention relates to a semiconductor device and its manufacture method, and more particularly to a semiconductor device having multilevel copper wiring layers and its manufacture method.

B) Description of the Related Art

The integration degree and operation speed of large scale integrated circuits are becoming increasingly high. As the integration degree becomes higher, semiconductor elements such as transistors constituting an integrated circuit is made more compact. A compact semiconductor element improves the operation speed. A delay time by wiring regulates the operation speed of a large scale integrated circuit. A wiring delay time depends on the wiring resistance and parasitic capacitance. Reducing the wiring resistance and parasitic capacitance is desired.

Low resistance of wiring is realized by the main wiring material of Cu having a lower resistance than Al. Wiring material having a resistance lower than Cu is practically difficult.

As semiconductor elements are made fine, the number of semiconductor elements fabricated on one semiconductor chip increases. The number of wiring lines is increased in order to interconnect a number of semiconductor elements. As the number of power supply lines and signal lines increases, the number of wiring layers increases. High density of wiring lines increases a wiring capacity.

In order to shorten a wiring delay time, the wiring capacitance is required to be lowered. The material of interlayer insulating films for conventional Cu wiring layers is silicon oxide, F-doped silicate glass (FSG) or the like. An interlayer insulating film made of material having a smaller specific dielectric constant is desired to lower the wiring capacitance.

In order to lower a wiring capacitance, organic insulating material having a low specific dielectric constant has been proposed as the material of an interlayer insulating film. One example of organic materials, SILK (Trademark: Dow Chemical), has a specific dielectric constant of 2.65. As compared to $SiO_2$ having a specific dielectric constant of 4.2, the capacitance can be lowered by about 40%.

After organic insulating material is coated in a liquid state, it is necessary to perform heat treatment at a temperature of about 400° C. for example. Organic insulating material has generally a large thermal expansion coefficient. The thermal expansion coefficient of $SiO_2$ is about 0.6 ppm, whereas that of SILK is about 69 ppm. After the heat treatment is performed to form an insulating film, large tensile stress is generated at a room temperature.

FIG. 2 shows an example of the structure of a large scale integrated circuit having interlayer insulating films made of organic insulating material. In the surface layer of a silicon substrate 10, an element separation trench is formed and insulating material such as silicon oxide is embedded to form a shallow trench isolation (STI) 11. On the surface of an active region defined by STI, a gate G of a MOS transistor is formed. In this way a transistor is formed. Necessary ions are implanted into the silicon substrate and other necessary processes are performed.

On the surface of the semiconductor substrate 10, an insulating layer 18 of a silicon oxide series such as phosphosilicate glass (PSG) is formed. Contact holes are formed and conductive material is filled in to form conductive plugs 19. After the surface of the insulating film is planarized, an SiC layer 20, a SILK layer 22 and an SiC layer 23 are laminated to form a first interlayer insulating film. For example, the SiC layer 20 is about 50 nm thick, the SILK layer 22 is about 450 nm, and the SiC layer 23 is about 50 nm. In this interlayer insulating film, wiring trenches and via holes for connection to the underlying wiring layer are formed and a first wiring layer 29 made of copper as its main component is embedded.

After the surface of the first interlayer insulating film is planarized, an SiC layer 30, a SILK layer 32 and an SiC layer 33 similar to those described above are formed to form a second interlayer insulating film. In the second interlayer insulating film, wiring trenches and connection via holes are formed and a second wiring layer 39 made of copper as its main component is embedded. Similarly, a third interlayer insulating film is formed by a lamination of an SiC layer 40, a SILK layer 42 and an SiC layer 43 and a third wiring layer 49 is embedded. A fourth interlayer insulating film is formed by a lamination of an SiC layer 50, a SILK layer 52 and an SiC layer 53 and a fourth wiring layer 59 is embedded. An SiC layer 60 is formed on the surface of the fourth wiring layer as a copper diffusion preventing layer.

With this structure, peel-off or separation is likely to occur between the lower layers of the interlayer insulating films, i.e., copper diffusion preventing SiC layers 20, 30, 40 and 50 and the overlaid organic insulating resin layers 22, 32, 42 and 52. If the number of wiring layers is increased, separation is more likely to occur.

Separation does not occur between the SiC layer used as a hard mask and the underlying organic insulating resin layer. This may be ascribed to an improved surface quality of the organic insulating resin layer because the surface is exposed to plasma when the SiC layer is formed by plasma CVD.

SUMMARY OF THE INVENTION

It is an object of the invention to provide a semiconductor device having copper wiring layers and organic insulating resin layers with less separation and its manufacture method.

It is another object of the invention to provide a semiconductor device having a multilevel wiring structure and high reliability and being capable of high speed operation.

According to one aspect of the present invention, there is provided a semiconductor device comprising: a semiconductor substrate formed with a number of semiconductor elements; a first interlayer insulating film formed above the semiconductor substrate and having a first wiring recess; a first copper wiring embedded in the first wiring recess; a second interlayer insulating film having a second wiring recess, the second interlayer insulating film including a copper diffusion preventing layer formed on the first copper wiring and the first interlayer insulating film, an oxide film formed on the copper diffusion preventing layer, and an organic insulating resin layer formed on the oxide film; and a second copper wiring embedded in the second wiring recess.

According to another aspect of the present invention, there is provided a method of manufacturing a semiconductor device, comprising steps of: (A) forming a first interlayer insulating film above a semiconductor substrate formed with a number of semiconductor elements; (B) forming a first wiring recess through the first interlayer insulating film; (C) embedding a first copper wiring in the first wiring recess; (D) forming a second interlayer insulating film on the first interlayer insulating film, the second interlayer insulating film covering the first copper wiring and including a copper diffusion preventing layer, a first oxide film and an organic insulating resin layer in this order from a bottom; (E) forming a second wiring recess through the second interlayer insulating film; and (F) embedding a second copper wiring in the second wiring recess.

The oxide film has the function of an adhesion layer between the copper diffusion preventing layer and organic insulating resin layer. Since the oxide film exists, separation is not likely to occur. Since the oxide film has a high specific dielectric constant, a wiring capacity increases if it is made thick. The oxide film has preferably a thickness of 5 to 20 nm.

As above, even if an organic insulating resin layer is used as the interlayer insulating film, it becomes possible to suppress separation.

DESCRIPTION OF THE PREFERRED EMBODIMENTS

An embodiment of the invention will be described with reference to the accompanying drawings.

Figure 1A:
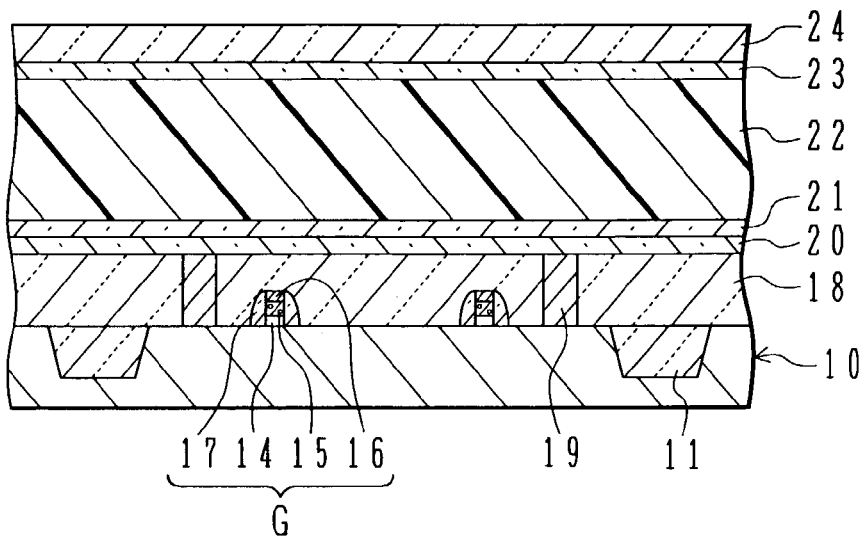
FIGS. 1A to 1K are schematic cross sectional views illustrating the processes of manufacturing a semiconductor device according to an embodiment of the invention.

As shown in FIG. 1A, an element separation trench is formed in the surface layer of a silicon substrate 10 and insulating material such as silicon oxide is embedded to form a shallow trench isolation (STI) 11. If necessary, before or after STI is formed, ions are implanted to form desired well regions in the surface layer of the silicon substrate 10.

An insulated gate electrode G is formed on the surface of the silicon substrate 10. The insulated gate electrode G is made of a lamination of a gate oxide film 14, a polysilicon gate electrode 15 and a silicide electrode 16. Side wall spacers 17 of silicon oxide or the like are formed on the side walls of the insulated gate electrode G. Desired ions are implanted into the silicon substrate on both sides of the gate electrode G before and after the side wall spacers 17 are formed, to thereby form source and drain regions with extensions. A CMOS transistor structure is formed by forming n- and p-channel transistors.

After the transistor structure is formed, a phosphosilicate glass (PSG) layer 18 is formed on the surface of the silicon substrate 10 by CVD, and the surface of this layer is planarized. Contact holes are formed through the PSG layer 18 and conductive plugs 19 made of a TiN barrier layer and a CVD W layer are filled in the contact holes. An unnecessary conductive layer on the surface of the PSG layer 18 is removed by chemical mechanical polishing (CMP) or the like.

Semiconductor elements and interconnect electrodes may be formed by any one of known manufacture methods. For example, the element separation regions may be formed by local oxidation of silicon (LOCOS) instead of STI. Pocket regions may be formed for a transistor. Instead of PSG, other oxide films or the like may be used. The barrier metal layer may be a lamination of a Ti layer, a TiN layer, a TaN layer and the like. The conductive plug may be made of silicon or the like.

After the conductive plug 19 is formed, an SiC layer 20 having a thickness of about 30 nm is formed on the surface of the PSG layer 18, covering the conductive plug 19. The SiC layer 20 is formed by plasma CVD under the conditions of a pressure of 1.8 torr and a substrate temperature of 400° C. while $Si(CH_3)_4$ of 500 sccm and $CO_2$ of 2500 sccm are flowed as source gasses.

After the SiC layer 20 is formed, an $SiO_2$ layer 21 as an adhesion layer is formed to a thickness of about 20 nm.

For example, the $SiO_2$ layer 21 is grown by plasma CVD under the conditions of an RF power of 320 W, a pressure of 4.5 torr and a substrate temperature of 400° C. while $SiH_4$ of 32 sccm, $N_2O$ of 480 sccm and $N_2$ of 4500 sccm are flowed as source gasses. The oxide film may be formed by other methods such as sputtering. By inserting an oxide film between an SiC layer and an organic insulating resin layer, adhesion can be improved.

The surface of the SiC layer is hydrophobic and the surface of the oxide is hydrophilic. Hydrophilic property and improved adhesion may be ascribed to OH bonds formed on the surface of the oxide. The SiC layer 20 and $SiO_2$ layer 21 provide the functions of a protective layer for a semiconductor element, an etch stopper layer and the like.

After the $SiO_2$ layer 21 is formed, an organic insulating resin layer 22 is formed on the surface of the $SiO_2$ layer. For example, the organic insulating resin layer 22 is made of SILK (registered trade mark) available from the Dow Chemical Company and has a thickness of about 450 nm. The organic insulating resin layer is formed by coating liquid of organic insulating resin, for example, by spin coating, baking it for 90 seconds at 320° C. to evaporate solvent and stabilize the resin, and thereafter performing a curing process for 30 minutes at 400° C. in an $N_2$ atmosphere. The hardening process changes triple coupling of C to a benzene ring so that the resin is chemically stabilized.

Materials other than SILK may be used for the organic insulating resin layer, such as FLARE (registered trademark) available from the Honeywell Electronic Materials Company. The organic insulating resin layer of FLARE is formed by spin coating followed by a heat treatment process, similar to the layer of SILK. The products sold under the trademarks SILK and FLARE are organic polymer-based low-k dielectric materials. The products sold under the trademarks SILK and FLARE are poly(arylene) ethers. The product sold under the trademark SILK is a crosslinked poly(arylene) ether. The product sold under the trademark FLARE is a poly(arylene) ether that is not crosslinked. The product sold under the trademark FLARE has a dielectric constant of 2.8. The phrase "low-k dielectric material" refers to a material with a dielectric constant less than 3.9.

On the organic insulating resin layer 22, a dual hard mask layer is formed by CVD. The dual hard mask layer is made of an SiC layer 23 of about 50 nm thick and an $SiO_2$ layer 24 of 100 nm thick. The growth condition of the SiC layer 23 is the same as that of the SiC layer 20. The growth condition of the $SiO_2$ layer 24 is a faster deposition speed than that for the $SiO_2$ layer 21. For example, the $SiO_2$ layer 24 is formed under the conditions of an RF power of 455 W, a pressure of 5 torr and a substrate temperature of 400° C. while $SiH_4$ of 130 sccm, $N_2O$ of 636 sccm and $N_2$ of 2000 sccm are flowed as source gasses.

Figure 1B:
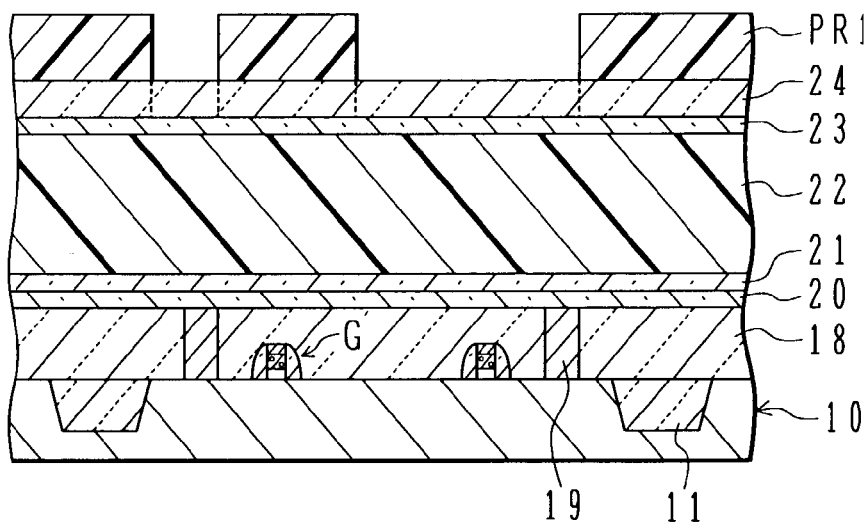

As shown in FIG. 1B, a photo resist layer is coated on the $SiO_2$ layer 24, exposed and developed to form a photo resist pattern PR1. The photo resist pattern PR1 has openings corresponding to a wiring pattern. By using the photo resist pattern PR1 as a mask, the SiO$_2$ layer 24 is etched. For example, the SiO$_2$ layer 24 having a thickness of about 100 nm is dry-etched by using CF$_4$/O$_2$/Ar as etchant gas. The photo resist pattern is thereafter removed.

Figure 1C:
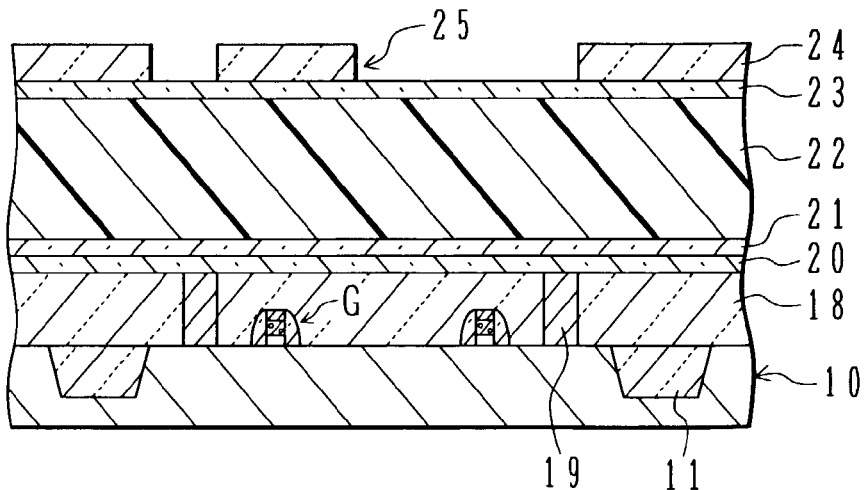

FIG. 1C is a schematic cross sectional view showing the substrate structure after etching. As shown, the SiO$_2$ layer 24 is selectively etched and trench openings 25 are formed which define the plan shape of a wiring pattern.

Figure 1D:
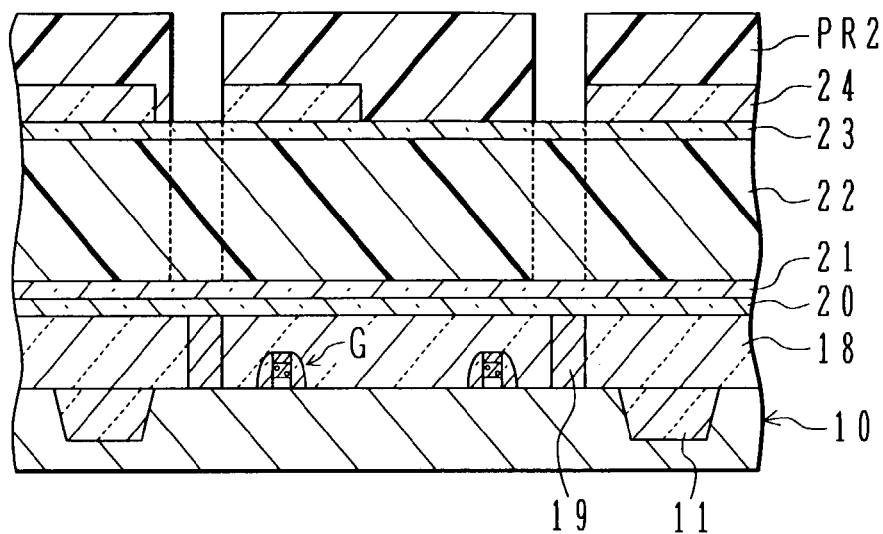

As shown in FIG. 1D, after the pattern of the SiO$_2$ layer 24 is formed, a new photo resist layer is coated on the whole surface of the substrate, exposed and developed to form a photo resist pattern PR2. The photo resist pattern PR2 has openings corresponding to via holes. By using the photo resist pattern PR2 as a mask, the SiC layer 23 and organic insulating resin layer 22 are etched.

First, the SiC layer 23 is dry-etched by using, for example, CH$_2$F$_2$/O$_2$/N$_2$ as etching gas. If there is mask misalignment and the SiO$_2$ layer 24 is exposed in the opening, both the SiO$_2$ layer 24 and SiC layer 23 are etched.

Next, the organic insulating resin layer 22 is dry-etched by using, for example, NH$_3$/Ar/N$_2$ as etching gas. During etching of the organic insulating layer 22, the photo resist pattern PR2 is also etched. After the photo resist pattern PR2 is etched, the patterned SiC layer 23 is used as the mask.

Figure 1E:
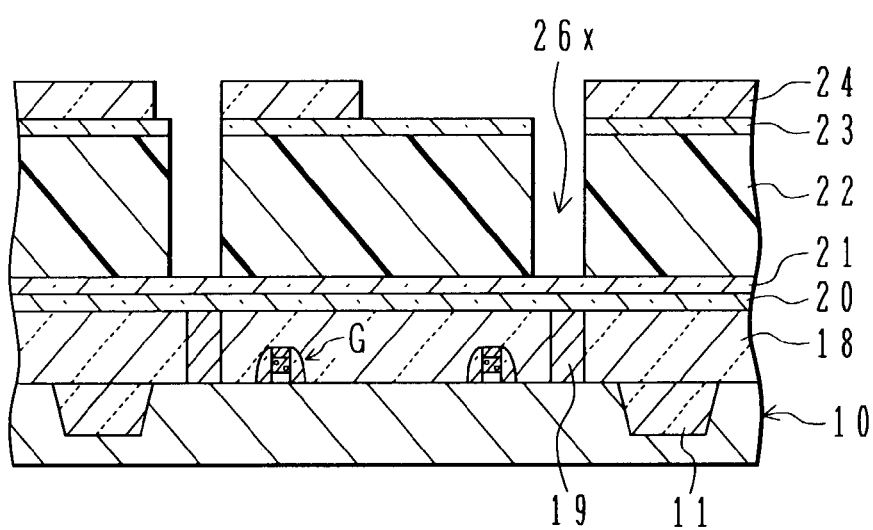

FIG. 1E is a schematic cross sectional view showing the substrate structure after etching. As shown, via holes 26$x$ reach the surfaces of the underlying SiO$_2$ layer 21. Organic insulating resin can be etched at a high selection ratio relative to an inorganic insulating layer such as an SiC layer and an oxide film.

Figure 1F:
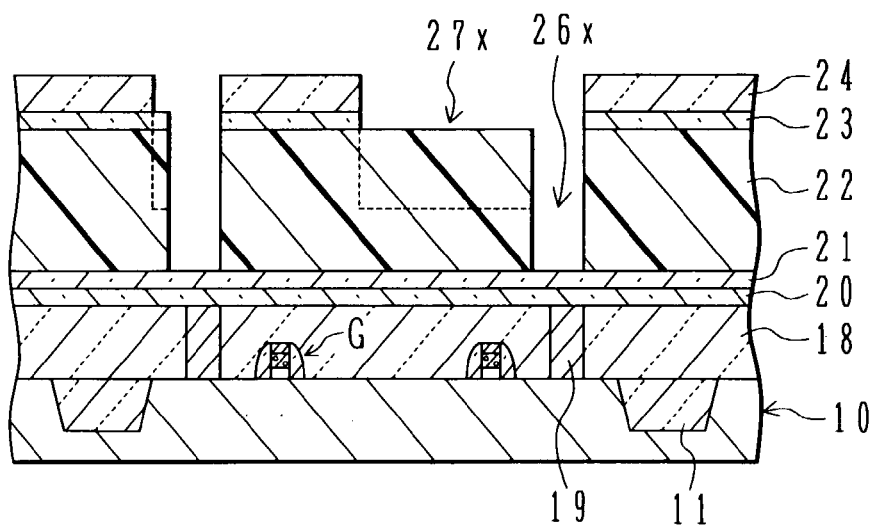

As shown in FIG. 1F, by using the SiO$_2$ layer 24 as a mask, the SiC layer 23 of about 50 nm thick is etched. The etching condition of the SiC layer 23 is the same as that described earlier for etching this layer 23 for example. The SiC layer 23 is etched to have a wiring trench shape. At this time, the mask SiO$_2$ layer 24 and the SiO$_2$ layer 21 exposed on the via hole bottom are slightly etched.

Next, by using the SiO$_2$ layer 24 and SiC layer 23 as a mask, the organic insulating resin layer 22 is etched to a depth of about 200 nm for example. The etching condition of the organic insulating resin layer 22 is the same as that described earlier for etching this layer 22 for example.

Thereafter, by using the organic insulating resin layer 22 as a mask, the SiO$_2$ layer 21 and SiC layer 20 exposed at the via hole bottom are etched. At this time, the top surface of the SiO$_2$ layer 24 is partially etched.

Figure 1G:
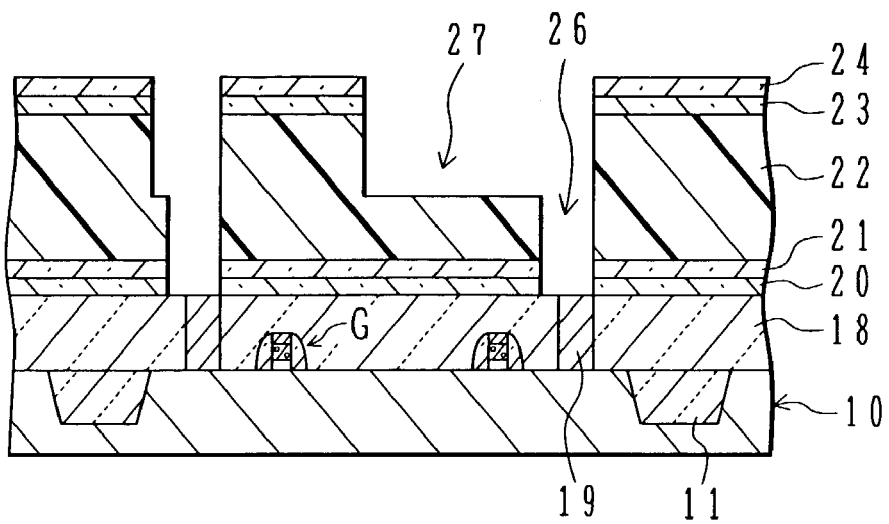

FIG. 1G is a schematic cross sectional view showing the substrate structure after etching. As shown, a wiring trench 27 is formed to a depth of 200 nm of the organic insulating resin layer 22, and a via hole 26 is formed at the deeper position so that the surface of the conductive plug 19 is exposed. This wiring recess is buried with a barrier metal layer and a copper layer to form dual damascene copper wiring.

Figure 1H:
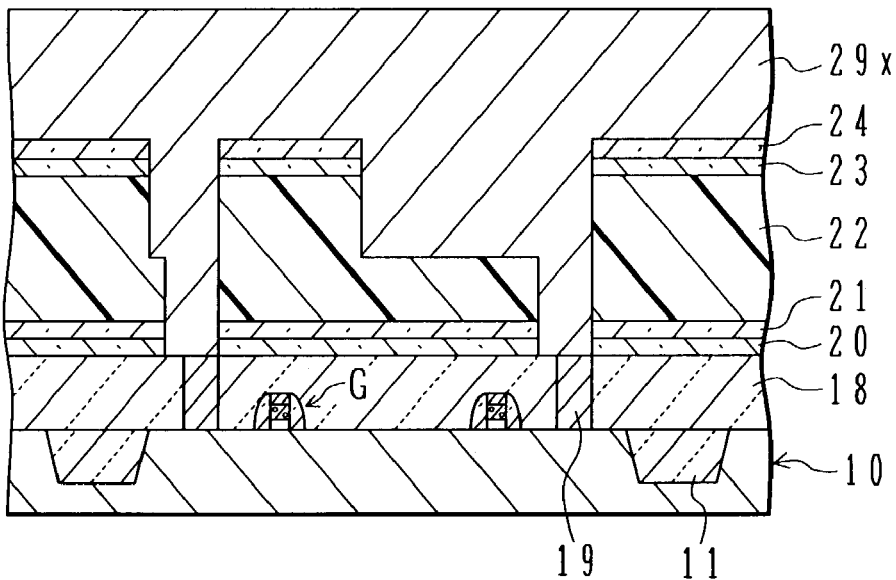

As shown in FIG. 1H, a Ta layer as a barrier metal layer is deposited on the whole substrate surface to a thickness of about 25 nm by sputtering. On the Ta layer, a Cu layer is deposited to a thickness of about 100 nm. The Ta layer functions as a barrier metal layer and the overlaid Cu layer functions as a seed layer for Cu plating. After the seed layer is formed, a Cu layer is deposited by electrolytic plating to form a wiring layer 29$x$.

Figure 1I:
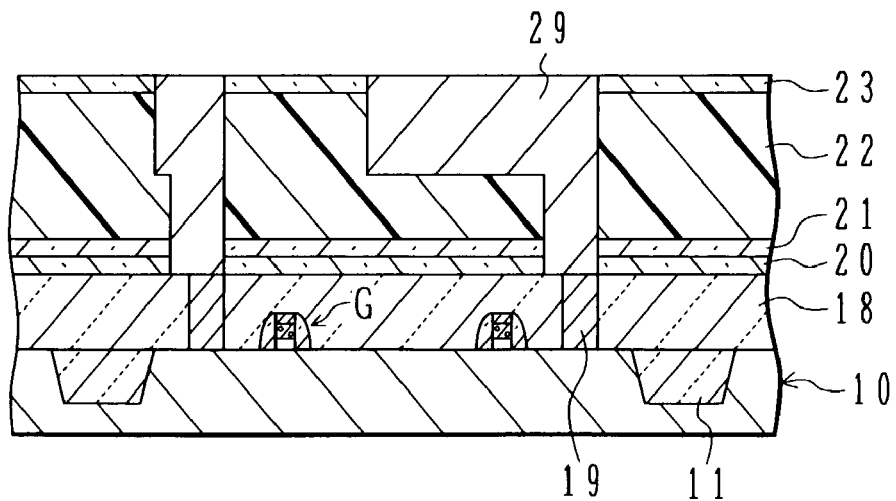

As shown in FIG. 1I, an unnecessary conductive layer over the interlayer insulating film is removed by chemical mechanical polishing (CMP). Since the SiC layer has a high selection ratio of CMP, CMP is performed by using the SiC layer 23 as a stopper. This CMP removes the SiO$_2$ layer 24. The substrate surface after CMP exposes the copper wiring layer 29 and SiC layer 23.

Figure 1J:
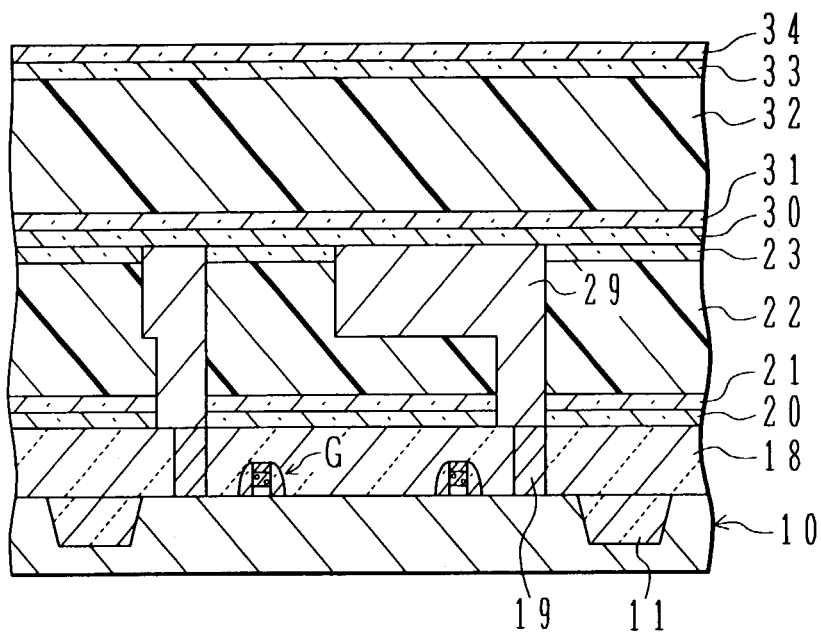

As shown in FIG. 1J, covering the copper wiring layer 29, a copper diffusion preventing SiC layer 30 is deposited on the SiC layer 23 to a thickness of about 50 nm by plasma CVD. For example, this plasma CVD is performed under the conditions of a pressure of 1.8 torr and a substrate temperature of 400° C. while Si(CH$_3$)$_4$ of 500 sccm and CO$_2$ of 2500 sccm are flowed as source gasses.

Next, on the SiC layer 30, an SiO$_2$ layer 31 as an adhesion layer is deposited to a thickness of about 20 nm by plasma CVD. The SiO$_2$ layer 31 improves the surface state of the copper diffusion preventing layer 30 and enhances adhesion. The SiO$_2$ layer 31 is formed in a better state on the hydrophobic surface of the copper diffusion preventing SiC layer 30 and forms a hydrophilic surface. On this hydrophilic surface, an organic insulating resin layer can be coated in a better state and with an improved adhesion.

The silicon oxide layer as an adhesion layer may not be a pure silicon oxide layer. A silicon oxide layer with additive may be used as an adhesion layer. The adhesion silicon oxide layer does not have the copper diffusion preventing function and has a high specific dielectric constant of about 4.2 or higher. It is therefore preferable to form the adhesion silicon oxide layer thin so long as it provides the function of the adhesion layer. It is preferable to form the silicon oxide layer of 5 nm to 200 nm thick as the adhesion layer.

The slower deposition speed is set as the plasma CVD condition for the silicon oxide layer 31. For example, the silicon oxide layer 31 is formed under the conditions of an RF power of 320 W, a pressure of 4.5 torr and a substrate temperature of 400° C. while SiH$_4$ of 32 sccm and N$_2$O of 480 sccm are flowed as source gasses and N$_2$ of 4500 sccm is flowed as carrier gas.

After the SiO$_2$ layer 31 is deposited, an organic insulating resin layer 32 is formed. An SiC layer 33 and an SiO$_2$ layer 34 are deposited as a hard mask layer. In this manner, the second interlayer insulating film is formed. The oxide film and SiC layer are preferably formed at a temperature of 500° C. or lower because there is the organic insulating resin layer. Above-mentioned plasma CVD and the like meet this condition.

The structure shown in FIG. 1J has the organic insulating resin layer still not formed with a wiring layer as shown in FIG. 1A. Processes similar to those shown from FIG. 1B to FIG. 1I are performed so that the second wiring layer can be formed. By repeating similar processes, the structure having a desired number of wiring layers can be formed.

Figure 1K:
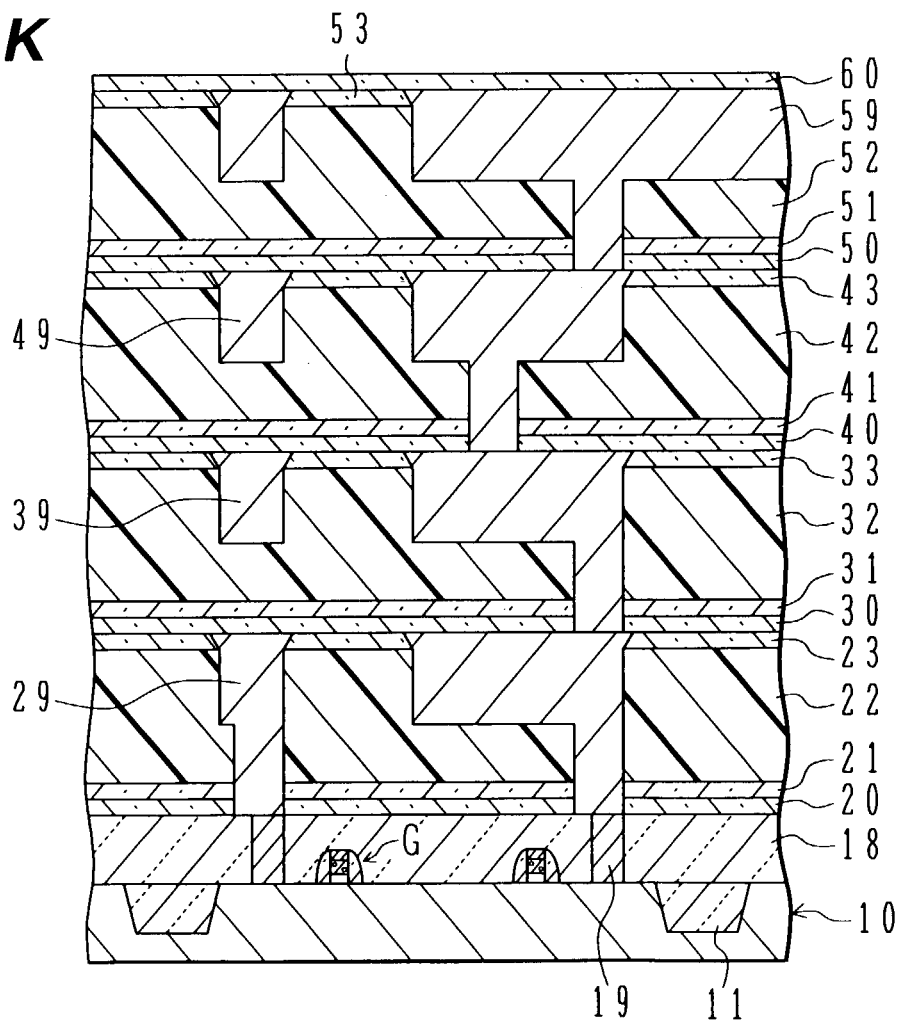
Figure 2:
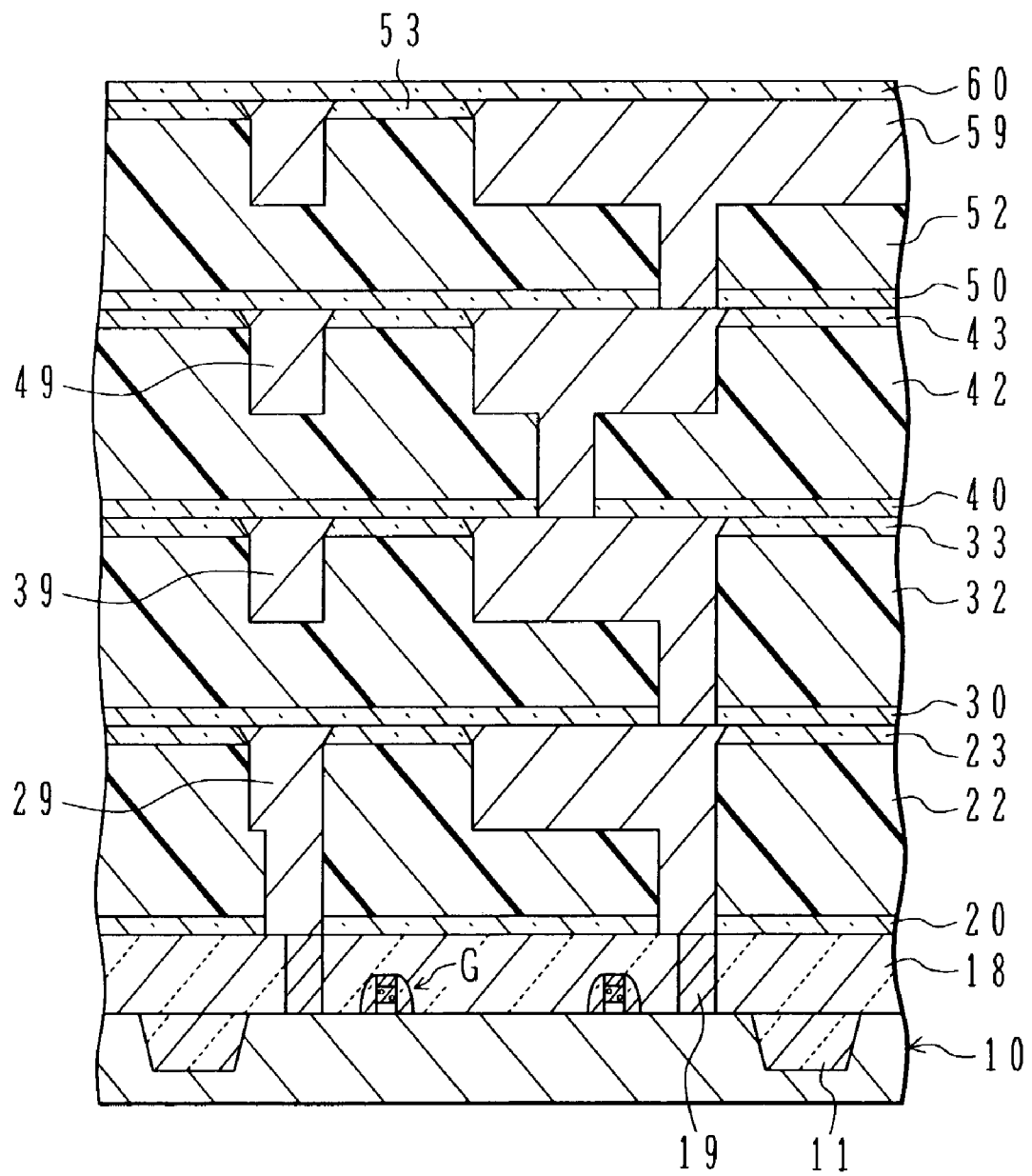
FIG. 2 is a schematic cross sectional view showing the structure of a semiconductor device according to related art.

FIG. 1K shows the structure of four wiring layers.

The second interlayer insulating film is made of a lamination of an SiC layer 30, an SiO$_2$ layer 31, an organic insulating resin layer 32, an SiC layer 33 and an SiO$_2$ layer (not shown). A wiring recess is formed and a second wiring layer 39 is embedded. An unnecessary wiring layer is removed by CMP and an oxide film 34 is removed. In this manner, the second wiring layer is formed.

The third interlayer insulating film is made of a lamination of an SiC layer 40, an SiO$_2$ layer 41, an organic insulating resin layer 42, an SiC layer 43 and an SiO$_2$ layer (not shown). A wiring recess is formed and a third wiring layer 49 is embedded. CMP is performed to expose the surface of the SiC layer 43. Similarly, the fourth interlayer insulating film is made of a lamination of an SiC layer 50, an SiO$_2$ layer 51, an organic insulating resin layer 52, an SiC layer 53 and an SiO$_2$ layer (not shown). A fourth wiring layer is formed by using a copper wiring layer 59. If the fourth wiring layer is the highest level layer, an SiC layer 60 as a copper diffusion preventing layer is formed on the surface of the fourth wiring layer.

As described above, a multilevel wiring structure is formed by using organic insulating resin layers of material having a low specific dielectric constant such as SILK. An oxide film as an adhesion layer is inserted between the organic insulating resin layer and underlying copper diffusion preventing layer. The oxide film functions as a separation or peel-off preventing layer.

Scratch tests were conducted. The result of scratch tests was 13.07 gF when the oxide film was not inserted. The result of scratch tests was 14.12 gF when an $SiO_2$ layer was inserted between the organic insulating resin layer and underlying SiC layer. Adhesion can be improved and separation of the interlayer insulating film can be suppressed.

Although the SiC layer is used as the copper diffusion preventing layer in the embodiment, an SiN layer or an SiCN layer may also be used as the copper diffusion preventing layer.

The present invention has been described in connection with the preferred embodiments. The invention is not limited only to the above embodiments. It is apparent that various modifications, improvements, combinations, and the like can be made by those skilled in the art.

What we claim are:

1. A semiconductor device comprising:
   a semiconductor substrate formed with a number of semiconductor elements;
   a first interlayer insulating film formed above said semiconductor substrate and having a first wiring recess;
   a first copper wiring embedded in the first wiring recess;
   a second interlayer insulating film having a second wiring recess comprising a wiring trench and a via hole extending in a depth direction from a bottom of said wiring trench, said second interlayer insulating film including a first silicon carbide layer formed on said first copper wiring and said first interlayer insulating film, a silicon oxide film formed directly on the first silicon carbide layer, an organic insulating resin layer formed on the silicone oxide film, and a second silicon carbide layer formed directly on said organic insulating layer, said wiring trench being formed in said second silicon carbide layer and said organic insulating resin layer; and
   a second copper wiring embedded in the second wiring recess.

2. A semiconductor device according to claim 1, wherein the organic insulating resin layer has a specific dielectric constant of three or lower.

3. A semiconductor device according to claim 1, wherein a thickness of the silicon oxide film is 5 to 20 nm.

4. A semiconductor device according to claim 1, wherein said second interlayer insulating film further includes a hard mask layer formed on the organic insulating resin layer.

5. A semiconductor device according to claim 4, wherein the hard mask layer is the second SiC layer.

6. A method of manufacturing a semiconductor device, comprising steps of:
   (A) forming a first interlayer insulating film above a semiconductor substrate formed with a number of semiconductor elements;
   (B) forming a first wiring recess through said first interlayer insulating film;
   (C) embedding a first copper wiring in said first wiring recess;
   (D) forming a second interlayer insulating film on said first interlayer insulating film, said second interlayer insulating film covering said first copper wiring and including a first silicon carbide layer, a first silicon oxide film, an organic insulating resin layer and a second silicon carbide layer in this order from a bottom, comprising the sub-steps of:
   (D-1) depositing the first silicon carbide layer on the first interlayer insulating film by CVD;
   (D-2) depositing the first silicon oxide film directly on the first silicon carbide layer by CVD;
   (D-3) coating a liquid layer of an organic insulating resin on the first silicon oxide film, and curing the liquid layer to form the organic insulating resin layer; and
   (D-4) depositing a second silicon carbide layer on the organic insulating resin layer by CVD;
   (E) forming a second wiring recess comprising a wiring trench and a via hole extending in a depth direction from a bottom of said wiring trench through said second interlayer insulating film, said wiring trench being formed in said second silicon carbide layer and said organic insulating resin layer; and
   (F) embedding a second copper wiring in said second wiring recess.

7. A method of manufacturing a semiconductor device according to claim 6, wherein the organic insulating resin layer has a specific dielectric constant of three or lower.

8. A method of manufacturing a semiconductor device according to claim 6, wherein said second interlayer insulating film further includes a second solicon oxide film, said step (D) further comprising the sub-step of:
   (D-5) depositing a second silicon oxide film on the second silicon carbide layer by CVD,
   wherein the second silicon oxide film and the second silicon carbide layer serve as a hard mask layer formed on the organic insulating resin layer.

9. A method of manufacturing a semiconductor device according to claim 8, wherein said step (E) comprises the sub-steps of:
   (E-1) forming a first aperture in said second silicon oxide film using a first photo-resist pattern, the first aperture having a shape of said wiring trench;
   (E2) forming a second aperture in said in said second silicon carbide layer in said first aperture, using a second photo-resist pattern, the second aperture having a shape of said via hole;
   (E-3) etching the organic insulating resin layer, using said second silicon carbide layer provided with the second aperture as an etching mask; and
   (E-4) etching the second silicon carbide layer and partial thickness of the organic insulating resin layer, using said second silicon oxide layer provided with the first aperture as an etching mask.

10. A method of manufacturing a semiconductor device according to claim 9, wherein said step (E) further comprises the sub-step of:
    (E-5) etching the first silicon oxide film and the first silicon carbide layer using the organic insulating resin layer as an etching mask.

11. A method of manufacturing a semiconductor device according to claim 8, wherein said step (F) includes a step of depositing a layer of the second copper wiring and a step of polishing and removing an unnecessary layer of the second copper wiring on said second interlayer insulating film and the second silicon oxide film.

12. A method of manufacturing a semiconductor device according to claim 7, wherein the organic insulating resin is polyarylene ether.

13. The method of manufacturing a semiconductor device according to claim 6, wherein, in the step of forming the second interlayer insulating film, the first silicon oxide film is formed prior to formation of the organic insulting resin layer.

14. A method of manufacturing a semiconductor device according to claim 6, wherein said sub-step (D-1) forms a silicon carbide layer having a hydrophobic surface, and said sub-step (D-2) forms a silicon oxide film having a hydrophilic surface.

15. A semiconductor device comprising:
a semiconductor substrate formed with a number of semiconductor elements;
a first interlayer insulating film formed above said semiconductor substrate and having a first wiring recess;
a first copper wiring embedded in the first wiring recess;
a second interlayer insulating film having a second wiring recess, said second wiring recess comprising a wiring trench and a via hole extending in a depth direction from a bottom of said wiring trench, said second interlayer insulating film including a first silicon carbide formed on said first copper wiring and said first interlayer insulating film, an adhesion layer formed of a silicon oxide film on the first silicon carbide layer, an organic insulating resin layer formed on said adhesion layer, said adhesion layer enhancing adhesion between said organic insulating resin layer and said first silicon carbide layer, and a second silicon carbide layer formed directly on said organic insulating resin layer, said wiring trench being formed in said second silicon carbide layer and said organic insulating resin layer; and
a second copper wiring embedded in the second wiring recess.

16. A semiconductor device according claim 1, wherein the organic insulating resin is polyarylene ether.

17. A semiconductor device according claim 15, wherein the organic insulating resin is polyarylene ether.

* * * * *